(12) United States Patent
Fagg (10) Patent No.: US 8,781,430 B2
(45) Date of Patent: Jul. 15, 2014

(54) RECEIVER FILTERING DEVICES, SYSTEMS, AND METHODS

(75) Inventor: Russell J. Fagg, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 931 days.

(21) Appl. No.: 12/494,109

(22) Filed: Jun. 29, 2009

(65) Prior Publication Data

US 2010/0327965 A1 Dec. 30, 2010

(51) Int. Cl.
*H04B 1/00* (2006.01)

(52) U.S. Cl.
USPC ........... 455/307; 455/130; 455/306; 455/137; 375/316; 375/346; 375/350; 327/352; 327/355

(58) Field of Classification Search
USPC ........... 455/424, 425, 456.5, 561, 550.1, 303, 455/501, 63.1, 412.1, 67.13, 278.1, 286, 455/339, 307, 306, 296; 375/350, 316, 346; 708/300, 301, 314; 700/94; 330/284, 330/305, 9; 341/150, 155; 327/355, 552, 327/352
See application file for complete search history.

(56) References Cited

U.S. PATENT DOCUMENTS

| | | | | |
|---|---|---|---|---|
| 4,775,851 A * | 10/1988 | Borth | .............................. | 341/155 |
| 5,325,204 A * | 6/1994 | Scarpa | ........................... | 348/607 |
| 6,177,897 B1 * | 1/2001 | Williams, III | ................. | 341/150 |
| 6,181,740 B1 | 1/2001 | Yasuda | | |
| 6,311,895 B1 * | 11/2001 | Olmstead et al. | ......... | 235/462.41 |
| 6,353,366 B1 * | 3/2002 | Chan et al. | ..................... | 330/305 |
| 6,404,278 B2 * | 6/2002 | Allen et al. | .................... | 327/557 |
| 6,437,932 B1 * | 8/2002 | Prater et al. | ...................... | 360/46 |
| 6,608,999 B1 * | 8/2003 | Jakobsson | ...................... | 455/303 |
| 6,668,029 B1 * | 12/2003 | Koslov et al. | .................. | 375/350 |
| 6,681,065 B1 * | 1/2004 | Minasian et al. | ................ | 385/27 |
| 6,703,894 B1 | 3/2004 | Stockstad et al. | | |
| 6,842,128 B2 * | 1/2005 | Koh | ............................. | 341/143 |
| 7,013,319 B1 * | 3/2006 | Gentile | .......................... | 708/319 |
| 7,102,559 B2 | 9/2006 | Van Tuijl | | |
| 7,671,658 B2 * | 3/2010 | Harada et al. | ................. | 327/355 |
| 7,756,498 B2 * | 7/2010 | Park | .......................... | 455/185.1 |
| 2003/0035499 A1 * | 2/2003 | Staszewski et al. | ........... | 375/346 |
| 2003/0105499 A1 * | 6/2003 | Hartley et al. | .................. | 607/17 |
| 2003/0112895 A1 * | 6/2003 | Cook et al. | ..................... | 375/316 |

(Continued)

FOREIGN PATENT DOCUMENTS

WO WO2005031755 A1 4/2005

OTHER PUBLICATIONS

International Search Report and Written Opinion—PCT/US2010/039970, ISA/EPO—Jun. 22, 2011.

*Primary Examiner* — Tuan Pham
(74) *Attorney, Agent, or Firm* — William M. Hooks (57) ABSTRACT

Exemplary embodiments of the invention disclose receiver baseband filtering. In an exemplary embodiment, the filter device may comprise a continuous-time filter and a discrete-time filter operably coupled to the continuous time-filter. The discrete-time filter may include a passive infinite impulse response filter operably coupled between the continuous-time filter and an amplifier. The discrete-time filter may also include an active infinite impulse response filter operably coupled between an output of the amplifier and an input of the amplifier. The discrete-time filter may be configured to combine an output of the active infinite impulse response filter and an output of the passive infinite impulse response filter to form a composite signal. Furthermore, the amplifier may be configured to receive and amplify the composite signal.

32 Claims, 9 Drawing Sheets

(56) References Cited

U.S. PATENT DOCUMENTS

| | | | |
|---|---|---|---|
| 2003/0133649 A1* | 7/2003 | Hakimi et al. | 385/24 |
| 2004/0227568 A1* | 11/2004 | Habboosh et al. | 330/10 |
| 2004/0260737 A1* | 12/2004 | Van Den Enden et al. | 708/300 |
| 2005/0040979 A1* | 2/2005 | Brooks et al. | 341/144 |
| 2005/0104654 A1 | 5/2005 | Muhammad et al. | |
| 2005/0278044 A1* | 12/2005 | Chen et al. | 700/94 |
| 2006/0045464 A1* | 3/2006 | Ono et al. | 386/46 |
| 2006/0164160 A1* | 7/2006 | Muhammad et al. | 327/552 |
| 2006/0239341 A1 | 10/2006 | Marlett et al. | |
| 2007/0005308 A1* | 1/2007 | Lee et al. | 703/2 |
| 2007/0008208 A1* | 1/2007 | Lakdawala et al. | 341/172 |
| 2007/0072574 A1* | 3/2007 | Ragan et al. | 455/313 |
| 2007/0275684 A1* | 11/2007 | Harada et al. | 455/185.1 |
| 2007/0285296 A1* | 12/2007 | Bilhan | 341/155 |
| 2008/0095269 A1* | 4/2008 | Frantzeskakis et al. | 375/302 |
| 2008/0212791 A1* | 9/2008 | Asada et al. | 381/71.6 |
| 2008/0288570 A1* | 11/2008 | Ferchland et al. | 708/425 |
| 2009/0080581 A1* | 3/2009 | Schuur et al. | 375/350 |
| 2009/0102546 A1* | 4/2009 | Miyagi et al. | 327/557 |
| 2009/0212867 A1* | 8/2009 | Fukuzawa et al. | 330/284 |
| 2010/0079204 A1* | 4/2010 | Ummelmann | 330/9 |
| 2010/0090757 A1* | 4/2010 | Finocchiaro | 327/554 |
| 2011/0040818 A1* | 2/2011 | Fagg et al. | 708/313 |
| 2011/0043374 A1* | 2/2011 | Bannister et al. | 340/870.02 |

* cited by examiner

RECEIVER FILTERING DEVICES, SYSTEMS, AND METHODS

BACKGROUND

1. Field

The present invention relates generally to electronic filters, and more specifically to devices, systems, and methods related to receiver baseband filtering.

2. Background

Filters are used extensively today in various electronic applications. A filter is an electrical network that alters the amplitude and/or phase characteristics of a signal as the frequency of the signal changes. Thus, a filter may be used in an electronic circuit to pass signals in certain frequency ranges and attenuate signals in other frequency ranges. The behavior of a filter may be described mathematically in the frequency-domain in terms of its transfer function. The transfer function describes, among other things, the ratio between the input signal amplitude and the output signal amplitude applied of the filter. The amplitude response curve describes the effect of the filter on the amplitude of the input signal at various frequencies. The steepness of the amplitude response curve is generally described in terms of the filter's quality factor and filter order.

Figure 1:
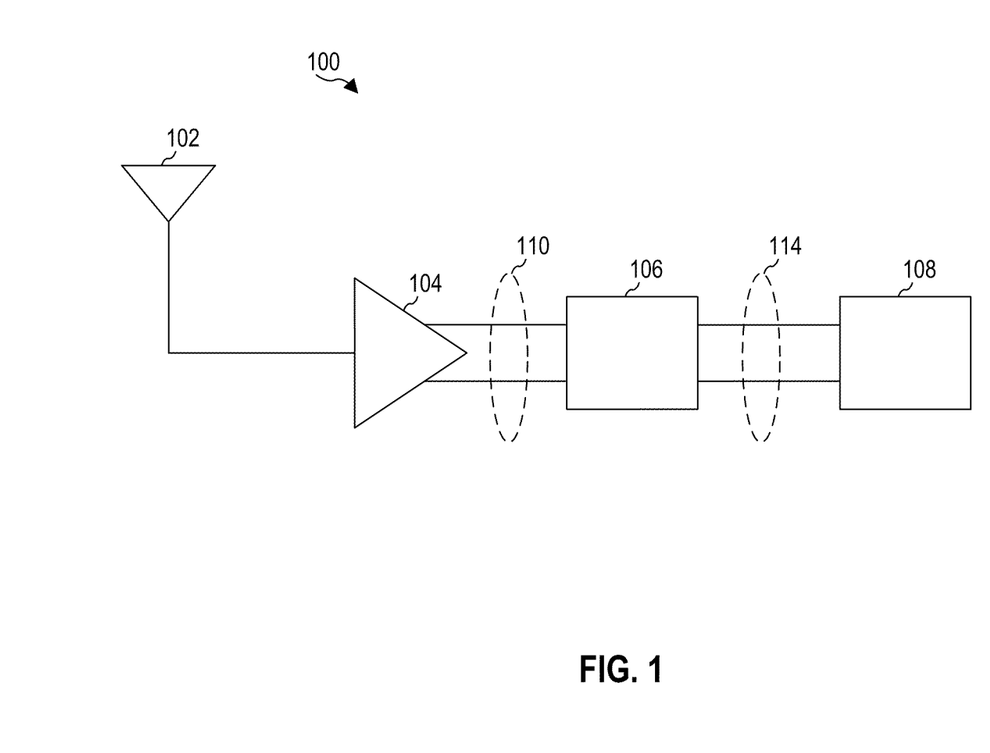
FIG. 1 is a block diagram of a conventional baseband filtering system.

FIG. 1 is a block diagram illustrating a conventional filtering system 100 configured to provide receiver baseband filtering. System 100 includes an antenna 102, a low-noise amplifier 104, a mixer 106, and a continuous-time baseband filter 108. As understood by a person having ordinary skill in the art, a signal received by antenna 102 may be amplified by low-noise amplifier 104 and, thereafter, low-noise amplifier 104 may output differential signal 110 corresponding to differential input of mixer 106. Differential signal 110 may then be down-converted to baseband by mixer 106, which outputs differential baseband signal 114. Differential baseband signal 114 may then be transmitted to continuous-time baseband filter 108, which is configured to filter differential baseband signal 114 before transmitting differential baseband signal 114 to an analog-to-digital converter (not shown).

As understood by a person having ordinary skill in the art, receiver baseband filtering has conventionally involved a trade-off between acceptable passband loss and adequate adjacent channel filtering. More specifically, a filter may be configured to position poles and zeros at an adequate distance away from a desired channel and, therefore, under worst case conditions (e.g., process, voltage, and temperature conditions), filtering of the desired channel is avoided. However, this may result in reduced adjacent channel filtering. Conversely, to limit passband loss, a filter may be configured to position poles and zeros beyond the passband edge to achieve acceptable passband loss but at the expense of poor adjacent channel filtering.

There is therefore a need in the art for a receiver baseband filter configured to provide adequate adjacent channel filtering while minimizing passband loss.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus (e.g., device) or method. In addition, like reference numerals may be used to denote like features throughout the specification and figures.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Various exemplary embodiments of the disclosure are described below. It should be apparent that the teachings herein may be embodied in a wide variety of forms and that any specific structure, function, or both being disclosed herein is merely representative. Based on the teachings herein one skilled in the art should appreciate that an exemplary embodiment disclosed herein may be implemented independently of any other exemplary embodiments and that two or more of these exemplary embodiments may be combined in various ways. For example, an apparatus may be implemented, or a method may be practiced, using any number of the exemplary embodiments set forth herein. In addition, such an apparatus may be implemented, or such a method may be practiced, using other structure, functionality, or structure and functionality in addition to or other than one or more of the exemplary embodiments set forth herein.

The teachings herein may be incorporated into various types of communication systems and/or system components. In some aspects, the teachings herein may be employed in a multiple-access system capable of supporting communication with multiple users by sharing the available system resources (e.g., by specifying one or more of bandwidth, transmit power, coding, interleaving, and so on). For example, the teachings herein may be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, High-Speed Downlink Packet Access (HSDPA) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein may be designed to implement one or more standards, such as IS-95, cdma2000, IS-856, W-CDMA, TDSCDMA, and other standards. A CDMA network may implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein may be implemented in a 3GPP Long Term Evolution (LTE) system, an Ultra-Mobile Broadband (UMB) system, and other types of systems. LTE is a release of UMTS that uses E-UTRA.

Figure 2:
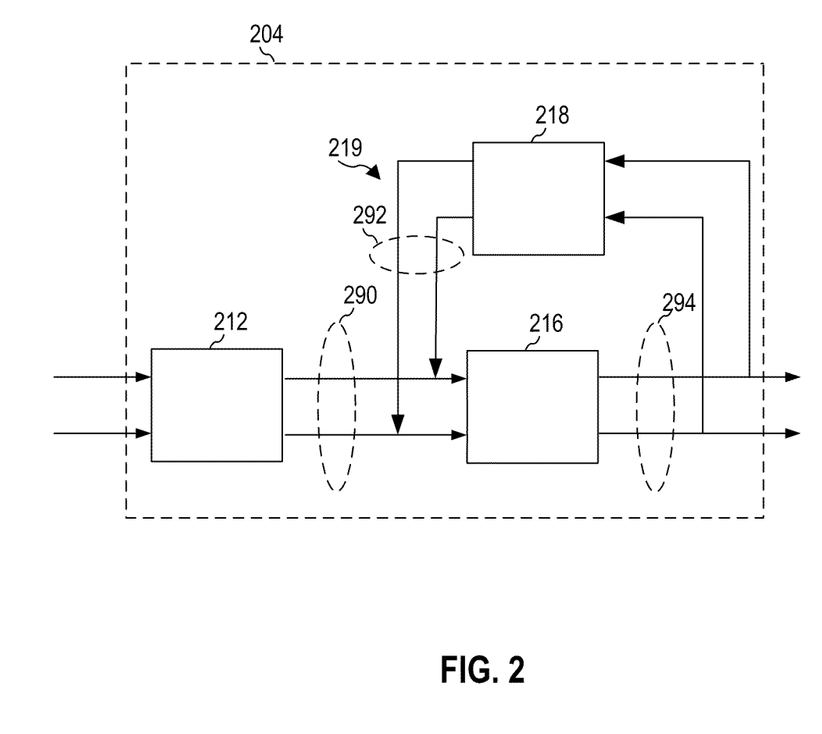
FIG. 2 is a block diagram of a discrete-time filter, in accordance with an aspect of a disclosed exemplary embodiment.

FIG. 2 is a block diagram depicting a discrete-time filter 204, according to one or more exemplary embodiments. Discrete-time filter 204 includes a passive infinite impulse response (IIR) filter 212 operably coupled to an input of an amplifier 216. For example only, amplifier 216 may comprise a switched capacitor amplifier. Discrete-time filter 204 also includes a feedback loop 219 including an active infinite impulse response (IIR) filter 218. As illustrated, an output of amplifier 216 is operably coupled to an input of active IIR filter 218 and an output of active IIR filter 218 is operably coupled to the input of amplifier 216. As configured, passive IIR filter 212 is adapted to receive a differential baseband signal from a continuous-time filter 202 (see FIG. 3), filter the differential baseband signal, and transmit a filtered differential signal 290 to amplifier 216. More specifically, passive IIR filter 212 may be configured to generate a pole within a passband of the received differential baseband signal. As understood by a person having ordinary skill in the art, positioning a pole within a passband may enhance adjacent channel filtering.

Amplifier 216 is configured to receive filtered differential signal 290 and output an amplified differential signal 294. Active IIR filter 218 is configured to sample differential signal 294 and, after a time delay, output differential signal 292, which may be combined (i.e., added) with differential signal 290 to form a differential composite signal. It is noted that signal addition is linear. Thereafter, the differential composite signal may be amplified by amplifier 216 and output as differential signal 294. Forming a differential composite signal, amplifying the composite signal, and, thereafter, outputting the amplified composite signal may at least partially compensate for passband loss as a result of the filtering provided by passive IIR 212 (i.e., placement of the pole within the passband). Stated another way, the frequency response of 218 may at least partially equalize the passband loss of passive IIR filter 212.

Figure 3:
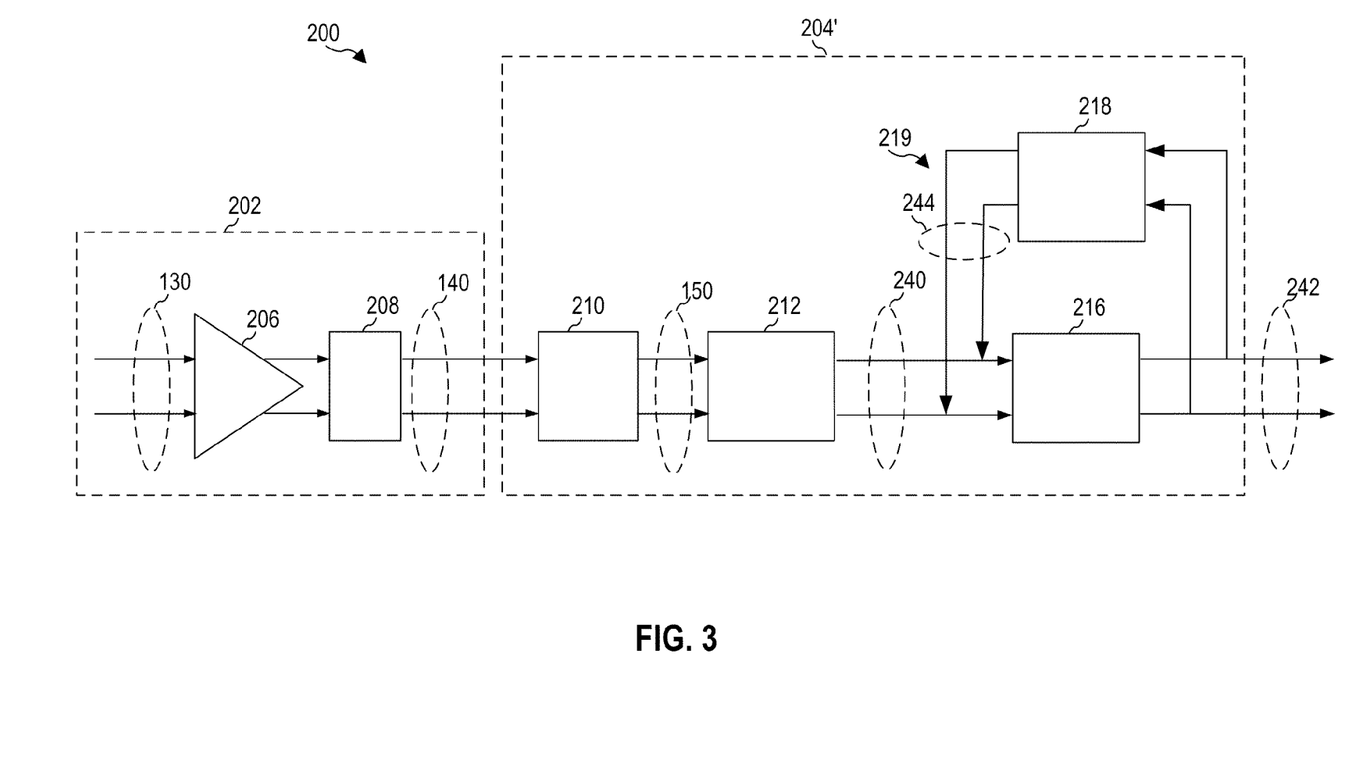
FIG. 3 is a block diagram of a filtering device including a discrete-time filter, in accordance with an aspect of a disclosed exemplary embodiment.

FIG. 3 is a block diagram illustrating a filtering device 200 including a continuous-time filter 202 operably coupled to a discrete-time filter 204', in accordance with one or more exemplary embodiments. Discrete-time filter 204' includes the elements of discrete-time filter 204 and additionally includes a voltage doubler 210 operably coupled between continuous-time filter 202 and an input of passive IIR filter 212. Continuous-time filter 202 may include a transimpedance amplifier (TIA) 206 configured to receive a differential current input from a front-end receiver (not shown). As understood by one having ordinary skill in the art, TIA 206 may be configured to receive and convert a differential current input 130 into an amplified differential voltage output. Additionally, an output of TIA 206 may include a capacitance (not shown) configured to generate a TIA pole. As illustrated in FIG. 3, TIA 206 may be operably coupled to RC pole generator 208 configured to provide alias filtering, and may be configured to generate, for example, two (2) RC poles. Although filtering device 200 is depicted as including continuous-time filter 202, any known and suitable continuous-time filter may be within the scope of the present invention.

Discrete-time filter 204' may include voltage doubler 210 operably coupled between continuous-time filter 202 and passive IIR filter 212. As understood by a person having ordinary skill in the art, voltage doubler 210 may be configured to sample a differential input voltage signal 140 and output a differential voltage signal 150 having a voltage substantially twice the amount of the sampled differential input voltage signal 140. Passive IIR filter 212 may include an array of capacitors (not shown) and may be configured to sample differential voltage signal 150 output from voltage doubler 210. Furthermore, passive IIR filter 212 may be configured to filter differential signal 150 and, thereafter, output filtered differential signal 240. More specifically, passive IIR filter 212 may be configured to generate a pole within a passband of differential signal 150. As mentioned above, a pole positioned with a passband may enhance filtering of adjacent undesired channels.

Discrete-time filter 204' may also include amplifier 216 having an input operably coupled to an output of passive IIR filter 212. As understood by a person having ordinary skill in the art, amplifier 216 may be configured to receive filtered differential signal 240 and output an amplified differential signal 242. Furthermore, discrete-time filter 204' may include feedback loop 219 comprising active IIR filter 218 wherein an input of active IIR filter 218 is operably coupled to an output of amplifier 216 and an output of active IIR filter 218 is operably coupled to the input of amplifier 216. Active IIR filter 218 may include an array of capacitors (not shown) and may be configured to filter differential signal 242 and output differential signal 244. More specifically, active IIR filter 218 may be configured to sample differential signal 242 with the array of capacitors and, initiate a delay of a number of samples and, thereafter, output differential signal 244. As a non-limiting example, the transfer function of active IIR filter 218 may be defined as:

$$H(s)=b/(1+aZ^{-n}); \quad (1)$$

wherein "a" is the ratio of the value of the capacitance within active IIR filter 218 to the value of the capacitance within passive IIR filter 212, "z" is a unit delay operator, "b" is a gain of amplifier 216, and "n" is the number of samples delayed. Accordingly, when $Z^{-n}=1$, active IIR filter 218 has a gain of $(1/(1+a))$. In addition, when $Z^{-n}=-1$, active IIR filter 218 has a gain of $(1/(1-a))$.

As illustrated in FIG. 3, differential signal 244 is coupled with differential signal 240 output from passive IIR filter 212.

More specifically, differential signal 244 and differential signal 240 may be connected in parallel and may, therefore, be combined (i.e., added). Furthermore, it is noted that because discrete-time filter 204' is only a function of a clock rate of discrete-time filter 204' and a ratio of capacitors values within passive IIR filter 212 and active IIR filter 218, differential signal 240 and differential signal 244 may track each other accurately over process, voltage, and temperature variations. Therefore, differential signal 240 and differential signal 244 may be combined in a reliable manner. Forming a composite signal by combining differential signal 240 and differential signal 244 may at least partially compensate for passband loss as a result of the filtering provided by passive IIR filter 212.

Figure 4:
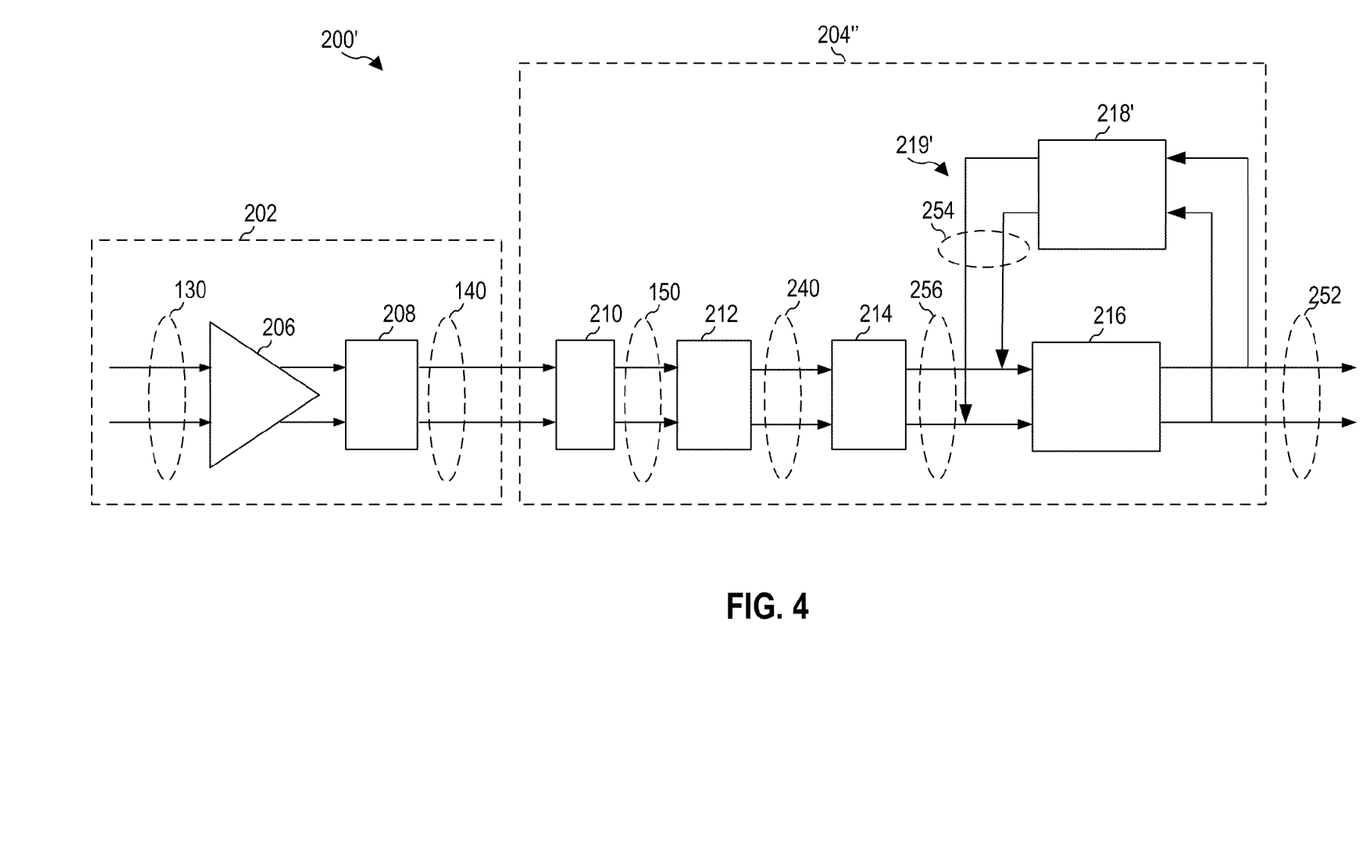
FIG. 4 is a block diagram of another filtering device including a discrete-time filter, in accordance with an aspect of a disclosed exemplary embodiment.

With reference to the block diagram depicted in FIG. 4, another filtering device 200' including a discrete-time filter 204", according to another exemplary embodiment, is depicted. Discrete-time filter 204" includes the elements of discrete-time filter 204' and additionally includes a decimating finite impulse response (FIR) filter 214 operably coupled between passive IIR filter 212 and amplifier 216. As understood by a person having ordinary skill in the art, decimating FIR filter 214 may include an array of capacitors (not shown) and may be configured to receive a differential input signal and output a differential signal having a reduced sampling rate in comparison to the received differential input signal.

As depicted in FIG. 4, decimating FIR filter 214 may be configured to receive differential signal 240 output from passive IIR 212. For example only, decimating FIR filter 214 may be configured to receive differential signal 240 at a rate of 640 mega samples per second (Ms/s) and output differential signal 256 at a rate of 160 Ms/s. Transmitting differential signal 256 at a reduced sample rate and, therefore, reducing the sampling rate of differential signal 252 may allow for a reduction of a number of elements (i.e., capacitors) required in an active IIR filter 218'. For example only, at a sampling rate of 640 Ms/s, active IIR filter 218' may require four times the amount of elements required for a sampling rate of 160 Ms/s. Stated another way, by reducing the sampling rate by a factor of four, the number of required elements within active IIR filter 218' may also be reduced by a factor of four.

With continued reference to FIG. 4, active IIR filter 218', positioned within a feedback loop 219', may be configured to sample differential signal 252 with an array of capacitors and, after initiating a delay of a number of samples (e.g., nine (9) samples), output differential signal 254. Furthermore, differential signal 254 and differential signal 256 may be combined by connecting differential signal 254 and differential signal 256 in parallel. It is noted that because discrete-time filter 204" is only a function of the clock rate of discrete-time filter 204" and a ratio of capacitors values within passive IIR filter 212, decimating FIR filter 214, and active IIR filter 218, differential signal 256 and differential signal 254 may track each other accurately over process, voltage, and temperature variations. Therefore, differential signal 254 and differential signal 256 may be combined in a reliable manner. As a non-limiting example, the transfer function of active IIR filter 218' may be defined as:

$$H(s) = b/(1 + aZ^{-n}); \quad (2)$$

wherein "a" is the ratio of the value of the capacitance within active IIR filter 218' to the value of the capacitance within decimating FIR filter 214, "z" is a unit delay operator, "b" is a gain of amplifier 216, and "n" is the number of samples delayed. Accordingly, when $Z^{-n}=1$, active IIR filter 218' has a gain of $(1/(1+a))$. In addition, when $Z^{-n}=-1$, active IIR filter 218' has a gain of $(1/(1-a))$.

It is noted that although FIGS. 2, 3, and 4 each illustrate a single passive IIR filter positioned within discrete-time filter 204/204'/204", in order to provide additional passband filtering, discrete-time filter 204/204'/204" may include more than one passive IIR filter, wherein each passive IIR filter may be configured to generate a pole within a passband of a received signal.

Figure 5:
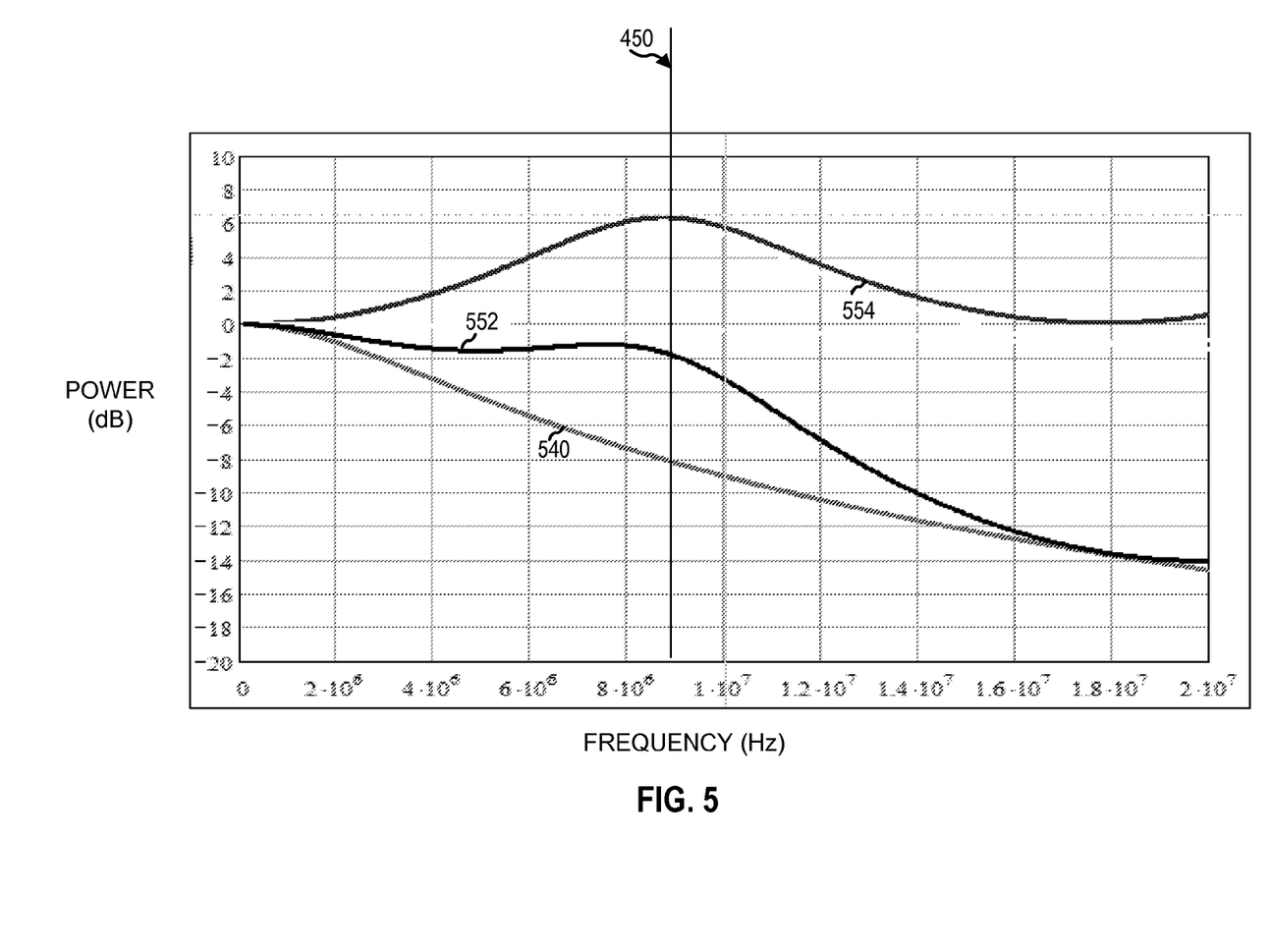
FIG. 5 is a diagram illustrating various frequency responses of the filtering device of FIG. 4.

FIG. 5 is a diagram illustrating frequency responses of passive IIR 212 (signal 540), discrete-time filter 204" (signal 552), and active IIR filter 218 (signal 554) relative to a band edge 450. It is noted that the frequency responses illustrated in FIG. 5 have been generated within filter device 200' for a received signal having a bandwidth of 10 MHz at baseband and wherein active IIR filter 218 initiated a delay of nine (9) samples. A contemplated operation of filtering device 200' will now be described with reference to FIGS. 4 and 5. Initially, TIA 206 may receive differential current input 130 and output an amplified differential voltage. Additionally, a TIA pole may be generated by a capacitance positioned at an output of TIA 206. For example only, for a received signal having a bandwidth of 10 MHz at baseband, the capacitance may be configured to generate a TIA pole at 12.5 MHz. Thereafter, two (2) RC poles, configured to provide alias filtering, may be generated by RC pole generator 208.

Voltage doubler 210 may then sample differential signal 140 output from continuous-time filter 202 and, thereafter, output differential voltage signal 150 having a voltage substantially twice the value of differential input voltage signal 140. Passive IIR filter 212 may then sample differential voltage signal 150 output from voltage doubler 210, filter differential voltage signal 150 and, subsequently, output filtered differential signal 240. For example only, for a received signal (i.e., differential voltage signal 150) having a bandwidth of 10 MHz at baseband, passive IIR filter 212 may be configured to generate a pole at 4 MHz. With reference to FIG. 5, signal 540 depicts a frequency response of passive IIR filter 212. As illustrated, signal 540 experiences attenuation in the passband due to the filtering provided by passive IIR filter 212. More specifically, for example, at 4 MHz, signal 540 attenuates approximately 3 dB.

Differential signal 240 may then be transmitted to decimating FIR filter 214, which may output differential signal 256 having a reduced sampling rate compared to differential signal 240. Thereafter, amplifier 216 may sample differential signal 256 and output amplified differential signal 252. Differential signal 252 may then be transmitted to active IIR filter 218', which may sample differential signal 252, initiate a delay of a number of samples and, subsequently, output differential signal 254. With reference to FIG. 5, signal 554 depicts a frequency response of active IIR filter 218'. As illustrated, signal 554 experiences a gain at frequencies in the passband. More specifically, for example, at 4 MHz, signal 554 has a gain of approximately 2 dB. Moreover, it is noted that, with a sampling rate of 160 Ms/s and a delay of nine (9) samples, signal 554 will be repeat approximately every 17.77 MHz (i.e., 160/9).

Differential signal 254 and differential signal 256 may be coupled in parallel and the resultant combined differential signal (i.e., a composite signal) may then be amplified by switched capacitor amplifier 216 producing differential signal 252. With reference to FIG. 5, signal 552 depicts a frequency response of the output of discrete-time filter 204". For example, at 4 MHz, signal 554 and signal 540 may be combined to produce a composite signal, which may then be amplified, resulting in signal 552.

Figure 6:
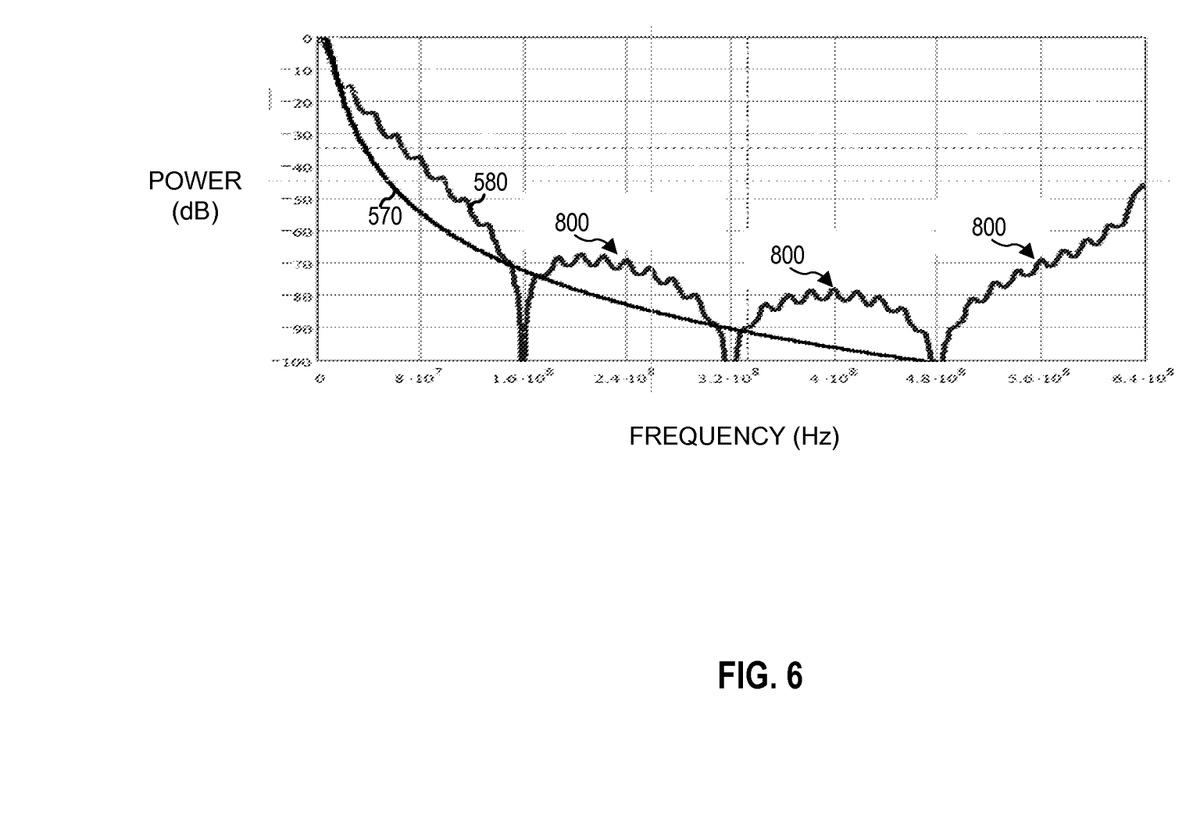
FIG. 6 is a diagram illustrating a comparison of a frequency response of the discrete-time filter of FIG. 4 and a model frequency response.

FIG. 6 is a diagram illustrating a comparison of a target frequency response signal 570 and a combined frequency response signal 580 of the entire filter device 200' including RC poles 208, passive IIR filter 212, decimating FIR 214, and active IIR filter 218. It is noted that frequency response signal 580 is generated by filter device 200' for a received signal having a bandwidth of 10 MHz at baseband and wherein decimating FIR filter 214 has output a signal having a sampling rate of 160 Ms/s and active IIR filter 218 has initiated a delay of nine (9) samples. As illustrated, signal 580 includes desired nulls at the decimating rates 160 MHz, 320 MHz, and 480 MHz due to decimating FIR filter 214 (see FIG. 4). Furthermore, the general downward trend of signal 580 is due at least in part to the RC poles (e.g. 2 RC poles) generated by RC pole generator 208. Furthermore, the undulating nature (depicted by numeral 800) of signal 580 is due at least in part to the repetitive nature of active IIR filter 218 (see FIG. 4), as mentioned above.

Figure 7:
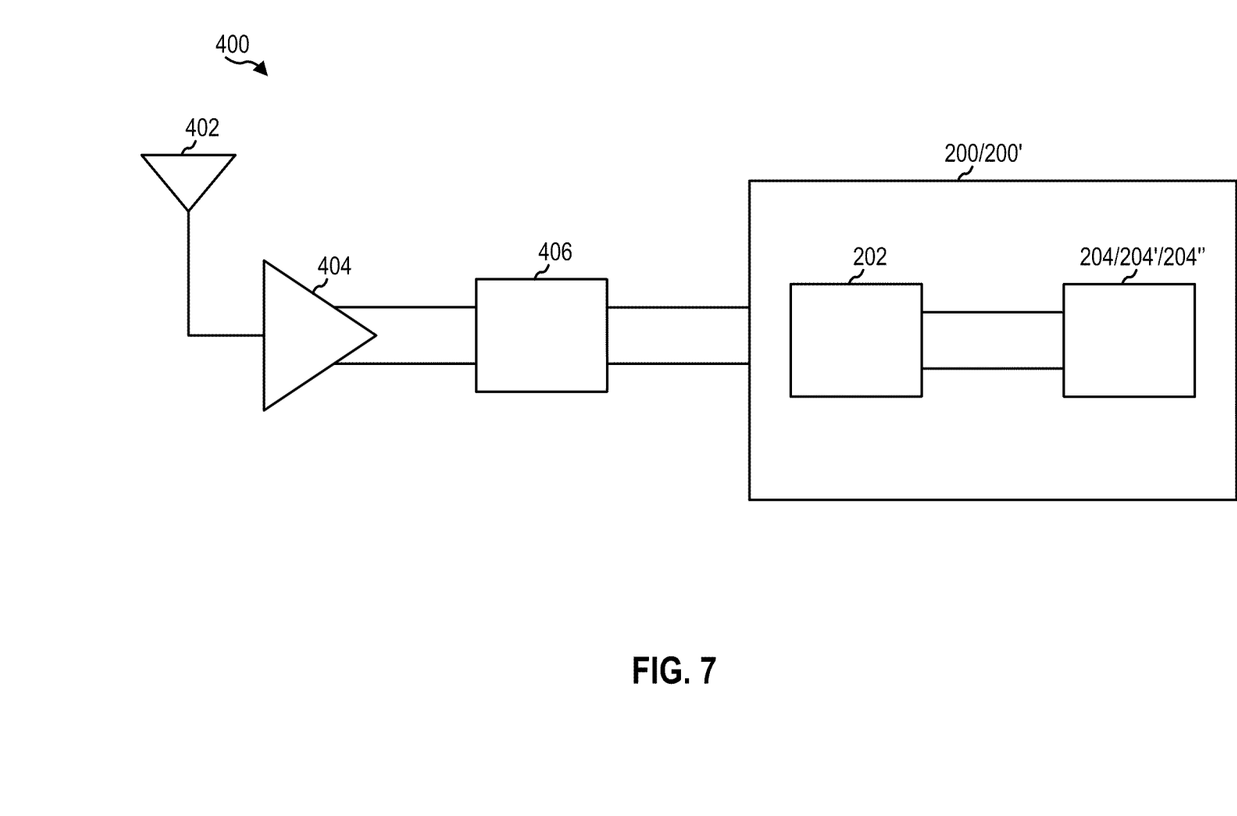
FIG. 7 is a block diagram of a filtering system comprising a filtering device including a discrete-time filter, in accordance with an aspect of a disclosed exemplary embodiment.

FIG. 7 is a block diagram illustrating a filter system 400 in accordance with one or more exemplary embodiments. As illustrated, filter system 400 may include an antenna 402, a low-noise amplifier 404, and a mixer 406. Furthermore, filter system 400 may include filtering device 200/200' including continuous-time filter 202 and discrete-time filter 204/204/204", in accordance with the exemplary embodiments described above. Antenna 402, low-noise amplifier 404, and mixer 406 may collectively be referred to as a "front-end receiver." It is noted that the exemplary embodiments, as described above, may be implemented with a continuous-time front-end receiver, a discrete-time front-end receiver, or any combination thereof. Furthermore, in order to avoid any undesired discontinuity within filter system 400, the timing signals of filtering device 200/200' may be synchronized with the timing signals of mixer 406.

Figure 8:
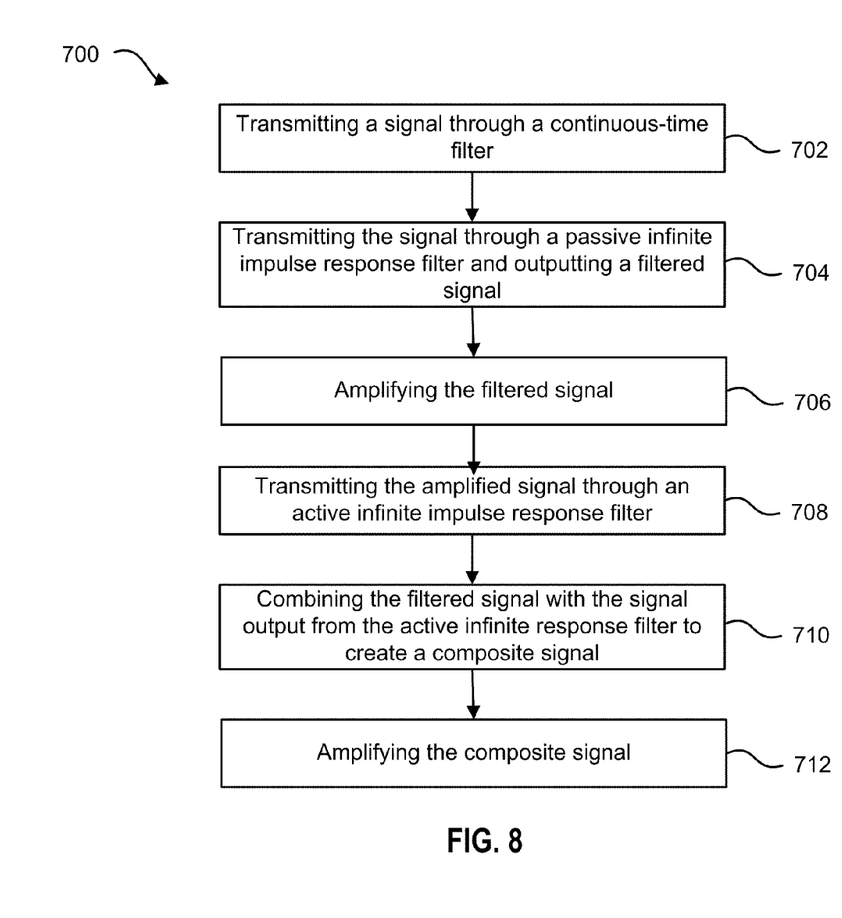
FIG. 8 is a flow-chart illustrating a method of filtering a signal, in accordance with an aspect of a disclosed exemplary embodiment.

FIG. 8 is a flow-chart illustrating a method 700 of filtering a signal, in accordance with one or more exemplary embodiments. Method 700 may include transmitting a signal through a continuous-time filter (depicted by numeral 702), and transmitting the signal through a passive infinite impulse response filter and outputting a filtered signal (depicted by numeral 704). Method 700 may further include amplifying the filtered signal (depicted by numeral 706) and transmitting the amplified signal through an active infinite impulse response filter (depicted by numeral 708) coupled between an output of the capacitor and an input of the capacitor. Method 700 may also include combining the filtered signal with the signal output from the active infinite response filter to create a composite signal (depicted by numeral 710) and amplifying the composite signal (depicted by numeral 712).

Figure 9:
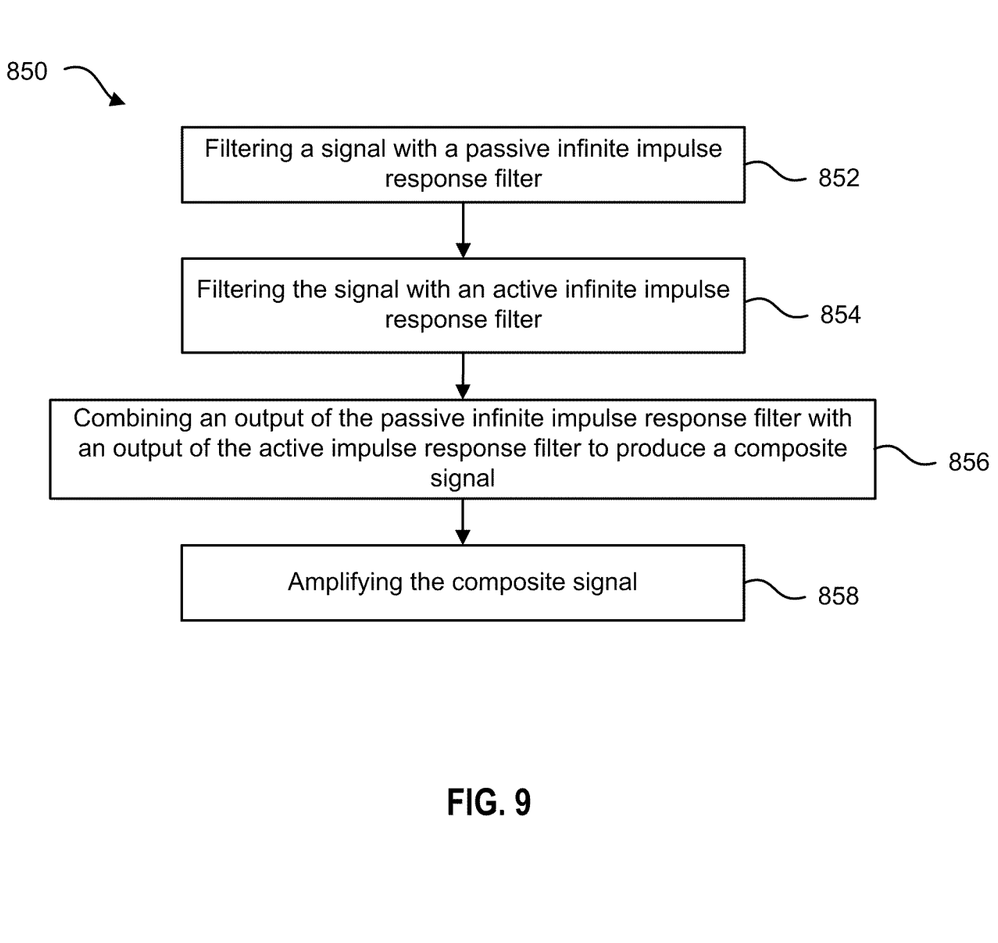
FIG. 9 is a flow-chart illustrating another method of filtering a signal, in accordance with an aspect of a disclosed exemplary embodiment.

FIG. 9 is a flow-chart illustrating another method 850 of filtering a signal, in accordance with one or more exemplary embodiments. Method 850 may include filtering a signal with a passive infinite impulse response filter (depicted by numeral 852) and filtering the signal with an active infinite impulse response filter (depicted by numeral 854). Method 850 may further include combining an output of the passive infinite impulse response filter with an output of the active impulse response filter to produce a composite signal (depicted by numeral 856) and amplifying the composite signal (depicted by numeral 858).

In contrast to a conventional continuous-time filter, a response of discrete-time filter 204/204/204" depends only a clock frequency and the relative capacitors values of the filter. Therefore, as long as the capacitors within discrete-time filter 204/204/204" are affected by process, voltage, and temperature variations in substantially the same manner (i.e. the capacitor values vary by the same amount and in the same direction), the location of poles within discrete-time filter 204/204/204" may remain fixed. As a result, the responses of passive IIR 212, decimating FIR filter 214, and active IIR 218 may track each other accurately over process, voltage, and temperature variations and, therefore, discrete-time filter 204/204/204" may exhibit increased precision in comparison to a continuous-time filter. This precision allows for a filter device configured for aggressive filtering in the passband (i.e., with one or more passive IIR filters) while at least partially compensating for passband loss with an active IIR filter in a feedback loop.

Furthermore, implementing a discrete-time filter may enable for a ratio of a sampling rate to a signal bandwidth to remain constant. As an example only, a signal having a 5 MHz bandwidth may be operated at a sampling rate of 40 MHz, a signal having a 10 MHz bandwidth may be operated at a sampling rate of 80 MHz, and a signal having a 20 MHz bandwidth may be operated at a sampling rate of 160 MHz. Therefore, the ratio of sampling rate to signal bandwidth is a constant (e.g., 8). Accordingly, for a discrete-time filter, the relative position of the poles and zeroes to the signal bandwidth may remain constant.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the exemplary embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A filter device, comprising:
a continuous-time filter; and
a discrete-time filter operably coupled to the continuous-time filter, the discrete-time filter comprising:
a passive infinite impulse response filter operably coupled to the continuous-time filter;
an amplifier operably coupled to the passive infinite impulse response filter and configured to receive and amplify a composite signal; and
an active infinite impulse response filter operably coupled between an output of the amplifier and an input of the amplifier;
wherein the discrete-time filter is configured to combine an output of the active infinite impulse response filter and an output of the passive infinite impulse response filter to produce the composite signal, wherein the active infinite impulse response filter is configured to generate from an amplified composite signal a frequency response having a gain at frequencies in a passband of a received signal.

2. The filter device of claim 1, further comprising a decimating finite impulse response filter operably coupled between the passive infinite impulse response filter and the amplifier and configured to reduce a sampling rate of a signal received from the passive infinite impulse response filter.

3. The filter device of claim 2, the decimating finite impulse response filter is reduces the sampling rate of the signal received from the passive infinite impulse response filter from 640 Ms/s to 160 Ms/s.

4. The filter device of claim 1, further comprising a voltage doubler operably coupled between the continuous-time filter and the passive infinite impulse response filter and to sample a differential input voltage signal and output a differential voltage signal having a voltage substantially twice the amount of the sampled differential input voltage.

5. The filter device of claim 1, wherein the continuous-time filter comprises a transimpedance amplifier operably coupled to a RC pole generator.

6. The filter device of claim 5, wherein the RC pole generator generates two RC poles.

7. The filter device of claim 5, wherein a capacitance at an output of the transimpedance amplifier generates a pole at 12.5 MHz for a received signal having a bandwidth of 10 MHz at baseband.

8. The filter device of claim 1, wherein the passive infinite impulse response filter generates a pole within the passband of the received signal.

9. The filter device of claim 1, wherein the discrete-time filter combines an output of the active infinite impulse response filter and an output of the passive infinite impulse response filter by coupling the output of the active infinite impulse response filter and the output of the passive infinite impulse response filter in parallel.

10. The filter device of claim 2, wherein the transfer function of the active infinite impulse response filter is defined by:

$$H(s)=b/(1+aZ^{-n});$$

wherein "a" is the ratio of the value of the capacitors within active infinite impulse response filter to the value of the capacitors within the decimating finite response filter, "z" is a unit delay operator, "b" is a gain of the amplifier, and "n" is the number of samples delayed.

11. The filter device of claim 1, wherein the passive infinite impulse response filter is configured to generate a frequency response that attenuates in a passband of a received signal.

12. The filter device of claim 1, wherein the amplifier comprises a switched capacitor amplifier.

13. A method of filtering a signal, comprising:
transmitting a signal through a continuous-time filter;
transmitting the signal through a passive infinite impulse response filter and outputting a filtered signal;
amplifying the filtered signal with an amplifier;
transmitting the amplified signal through an active infinite impulse response filter coupled between an output of the amplifier and an input of the amplifier;
combining the filtered signal with a signal output from the active infinite impulse response filter to create a composite signal; and
amplifying the composite signal, wherein the active infinite impulse response filter is configured to generate from an amplified composite signal a frequency response having a gain at frequencies in a passband of a received signal.

14. The method of claim 13, further comprising substantially doubling a voltage of the signal after transmitting the signal through the continuous-time filter.

15. The method of claim 13, wherein combining the filtered signal with a signal output from the active infinite impulse response filter to create a composite signal at least partially compensates for at least some passband loss due to transmission of the signal through the passive infinite impulse response filter.

16. The method of claim 13, wherein combining the filtered signal with the signal output from the active infinite impulse response filter comprises coupling the filtering signal in parallel with the signal output from the active infinite impulse response filter.

17. The method of claim 13, further comprising reducing a sampling rate of the filtered signal prior to amplifying the filtered signal.

18. A device that facilitates receiver baseband filtering, comprising:
    means for transmitting a signal through a continuous-time filter;
    means for transmitting the signal through a passive infinite impulse response filter and outputting a filtered signal;
    means for amplifying the filtered signal with an amplifier;
    means for transmitting the amplified signal through an active infinite impulse response filter coupled between an output of the amplifier and an input of the amplifier;
    means for combining the filtered signal with a signal output from the active infinite impulse response filter to create a composite signal; and
    means for amplifying the composite signal, wherein the active infinite impulse response filter is configured to generate from an amplified composite signal a frequency response having a gain at frequencies in a passband of a received signal.

19. A method of filtering a signal, comprising:
    filtering a signal with a passive infinite impulse response filter;
    filtering the signal with an active infinite impulse response filter;
    combining an output of the passive infinite impulse response filter with an output of the active infinite impulse response filter to produce a composite signal; and
    amplifying the composite signal, wherein the active infinite impulse response filter is configured to generate from an amplified composite signal a frequency response having a gain at frequencies in a passband of a received signal.

20. The method of claim 19, wherein combining comprises connecting the output of the passive infinite impulse response filter and the output of the active infinite impulse response filter in parallel to produce the composite signal.

21. The method of claim 19, wherein filtering a signal with a passive infinite impulse response filter comprises positioning a pole within the passband of the signal.

22. A device that facilitates receiver baseband filtering, comprising:
    means for filtering a signal with a passive infinite impulse response filter;
    means for filtering the signal with an active infinite impulse response filter;
    means for combining an output of the passive infinite impulse response filter with an output of the active infinite impulse response filter to produce a composite signal; and
    means for amplifying the composite signal, wherein the active infinite impulse response filter is configured to generate from an amplified composite signal a frequency response having a gain at frequencies in a passband of a received signal.

23. A discrete-time filter, comprising:
    a passive infinite impulse response filter configured to generate a pole within a passband of a received signal;
    a switched capacitor amplifier having an input operably coupled to an output of the passive infinite impulse response filter; and
    a feedback loop operably coupled between an output of the amplifier and the input of the amplifier and comprising an active infinite impulse response filter, wherein the discrete-time filter is configured to combine the output of the passive infinite impulse response filter and an output of the active infinite impulse response filter, wherein the active infinite impulse response filter is configured to generate from an amplified composite signal a frequency response having a gain at frequencies in a passband of a received signal.

24. The discrete-time filter of claim 23, further comprising a decimating finite impulse response filter operably coupled between the passive infinite impulse response filter and the amplifier.

25. The discrete-time filter of claim 23, further comprising a voltage doubler having an output operably coupled to the passive infinite impulse response filter.

26. The discrete-time filter of claim 23, wherein the active infinite impulse response filter is configured to sample an input signal with an array of capacitors, initiate a delay of a number of samples, and convey an output signal.

27. A receiver filtering system, comprising:
    a front-end receiver including an antenna, a low-noise amplifier, and a mixer; and
    a filter device coupled to the front-end receiver, the filter device comprising:
    a discrete-time filter operably coupled to a continuous-time filter, wherein the discrete-time filter comprises:
        a passive infinite impulse response filter operably coupled between an output of the continuous-time filter and an input of a switched capacitor amplifier; and
        an active infinite impulse response filter having an input operably coupled to an output of the switched capacitor amplifier and an output operably coupled to an input of the switched capacitor amplifier;
        wherein the discrete-time filter is configured to form a composite signal from the output of the active infinite impulse response filter and the output of the passive infinite impulse response filter, wherein the active infinite impulse response filter is configured to generate from an amplified composite signal a frequency response having a gain at frequencies in a passband of a received signal.

28. The receiver filtering system of claim 27, wherein the front-end receiver comprises one of a continuous-time front-end receiver and a discrete-time front-end receiver.

29. The receiver filtering system of claim 27, wherein the continuous-time filter is configured to receive a differential signal from the front-end receiver and provide alias filtering before transmitting the differential signal to the discrete-time filter.

30. A non-transitory computer-readable medium comprising program codes for causing a processor to:
    filter a signal with a passive infinite impulse response filter;

filter the signal with an active infinite impulse response filter; and combine an output of the passive infinite impulse response filter with an output of the active infinite impulse response filter to produce a composite signal, wherein the active infinite impulse response filter is configured to generate from an amplified composite signal a frequency response having a gain at frequencies in a passband of a received signal.

31. The non-transitory computer-readable medium of claim 30, wherein the codes for causing the processor to combine an output of the passive infinite impulse response filter with an output of the active infinite impulse response filter further cause the processor to:

connect the output of the passive infinite impulse response filter and the output of the active infinite impulse response filter in parallel to produce the composite signal.

32. The non-transitory computer-readable medium of claim 30, wherein the codes for causing the processor to filter a signal with a passive infinite impulse response filter further cause the processor to:

position a pole within the passband of the signal.

\* \* \* \* \*